(12) United States Patent
Tanizaki et al.

(10) Patent No.: US 6,295,238 B1
(45) Date of Patent: Sep. 25, 2001

(54) SEMICONDUCTOR MEMORY DEVICE HAVING A CIRCUIT FOR FAST OPERATION

(75) Inventors: Tetsushi Tanizaki; Katsumi Dosaka; Mikio Asakura, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/604,007

(22) Filed: Jun. 26, 2000

(30) Foreign Application Priority Data

Jun. 28, 1999 (JP) .................................................. 11-182335
Feb. 15, 2000 (JP) .................................................. 12-036777

(51) Int. Cl.$^7$ ....................................................... G11C 7/00
(52) U.S. Cl. .......................................... 365/201; 365/233
(58) Field of Search ................................... 365/201, 233

(56) References Cited

U.S. PATENT DOCUMENTS

| | | | |
|---|---|---|---|
| 5,243,703 | 9/1993 | Farmwald et al. | 395/325 |
| 6,141,278 | * 10/2000 | Nagase | 365/222 |

FOREIGN PATENT DOCUMENTS 11-86596  3/1999 (JP) .

* cited by examiner

*Primary Examiner*—David Nelms
*Assistant Examiner*—M. Tran
(74) *Attorney, Agent, or Firm*—McDermott, Will & Emery

(57) ABSTRACT

A semiconductor memory device includes a command decoder receiving an external signal and issuing a command, a clock buffer receiving an external clock, gates and a refresh counter. When a test signal is at L-level, an auto-refresh signal is issued in accordance with the output of the command decoder. When the test signal is at H-level, the auto-refresh signal is issued in accordance with the output (external clock) of the clock buffer. Thereby, the test can be performed with a good timing accuracy even by a low-speed tester.

8 Claims, 10 Drawing Sheets

EXTERNAL REFA COMMAND : /CS=L & /RAS=L & /CAS=L & /WE=H

EXTERNAL REFA COMMAND : /CS=L & /RAS=L & /CAS=L & /WE=H

SEMICONDUCTOR MEMORY DEVICE HAVING A CIRCUIT FOR FAST OPERATION

BACKGROUND OF THE INVENTION

1. Field of the Invention

The present invention relates to a semiconductor memory device, and particularly a semiconductor memory device having a function which allows a disturb test with good timing accuracy by a low-speed tester.

2. Description of the Background Art

A disturb test is a kind of known test for semiconductor memory devices. In the disturb test, a series of operations is performed as follows. A word line is raised to read out data in a memory cell onto a bit line. The data thus read is amplified by a sense amplifier, and is rewritten into the memory cell, and the word line is lowered. By the above operations, a memory cell on a neighboring unselected word line is disturbed.

In a conventional semiconductor memory device, an output (high-frequency signal) of an oscillator circuit arranged within the device is used as a trigger signal of the disturb test in order to use a low-speed tester for a short-cycle test, in which a period of each series of operations for the disturb test is reduced.

However, an influence by a process and test environments such as a temperature and a humidity cause variations in timing accuracy of the high-frequency signal forming the trigger. This results in a problem that the test cannot be performed accurately.

A testing burn-in apparatus which can test a large number of devices at a time may be used as the low-speed tester. In this case, the acceptance/rejection determination is performed in a scanning manner so that a long time is required for determining all the devices.

During the testing, a large number of devices are disturbed at a time so that the temperature in a burn-in tank rises, resulting in a strict environment for the devices. Accordingly, the device may enter an overtest specification state while the acceptance/rejection determination is being performed. This results in a problem that an acceptable device may be rejected depending on a margin.

SUMMARY OF THE INVENTION

Accordingly, the invention provides a semiconductor memory device which allows a disturb test to be performed effectively with a good timing accuracy by a low-speed tester.

According to an aspect of the invention, a semiconductor memory device includes a memory cell array including a plurality of memory cells arranged in rows and columns, and a plurality of word lines arranged corresponding to the plurality of rows of the memory cells; a test mode detecting circuit detecting in accordance with an external signal the fact that a test mode is set; and a control circuit being responsive to the output of the test mode detecting circuit and triggered by an external clock to perform control for conducting a disturb test on the memory cell array.

Preferably, the semiconductor memory device includes a clock buffer for receiving the external clock, and a row select control circuit for controlling selection of the row in the memory cell array. The control circuit is responsive to the output of the test mode detecting circuit to issue a signal determining operation timing of the row select control circuit based on the output of the clock buffer.

Preferably, the control circuit includes a refresh circuit issuing an automatic refresh signal for executing a refreshing operation of the memory cell array. The refresh circuit operates in a normal operation to issue the automatic refresh signal in response to an external command, and operates in the test mode to issue the automatic refresh signal in synchronization with the output of the clock buffer.

Preferably, the external clock includes a first external signal and a second external signal having the substantially same period as the first external signal. The device further comprises an internal clock generator generating an internal clock based on a phase difference between the first and second external signals. The control circuit performs the control for conducting the disturb test triggered by the internal clock.

Preferably, the device further includes a first buffer taking in the external clock, a second buffer taking in the external clock, and an internal clock generator generating an internal dock having double the frequency of the external clock in accordance with the outputs of the first and second buffers. The control circuit performs the control for conducting the disturb test triggered by the internal clock.

Preferably, the first and second buffers have the substantially same characteristics, and the internal clock generator generates the internal clock having the substantially constant pulse width based on the outputs of the first and second buffers.

Preferably, the external clock includes a first external signal and a second external signal having the substantially same period as the first external signal and the different phase from the first external signal. The device further comprises an internal clock generator generating an internal clock in accordance with the first and second external signals. The control circuit performs the control for conducting the disturb test triggered by the internal clock.

Preferably, the internal dock has pulses corresponding to rising and falling edges of the first external signal.

According to the semiconductor memory device described above, the disturb test triggered by the external clock is conducted on the memory cell array. Thereby, the test can be performed accurately even by a low-speed tester. By performing the refresh operation triggered by the external clock, the disturb test can be performed.

Further, the two external signals are used as the external clock, and the internal clock based on the phase difference between them is used as the trigger of the disturb test. Thereby, the short-cycle test can be effectively performed.

Further, the external clock is used to generate the internal clock having double the frequency, and the internal clock thus generated is used as the trigger of the disturb test. Thereby, the short-cycle test can be achieved effectively. In particular, by employing the buffer having the substantially constant characteristics, the internal clock having the uniform pulse width can be generated.

According to the semiconductor memory device described above, the internal clock is produced in accordance with the first and second external clocks having the same frequency and different phases, and is used as a trigger of the disturb test. In particular, in the case of the DDR-SDRAM, the internal dock has double the frequency of the first external clock so that the short-cycle test can be effectively performed.

Further, the invention provides a semiconductor memory device having a function of appropriately holding a state attained after a disturb test.

According to further another aspect of the invention, a semiconductor memory device includes a memory cell array including a plurality of memory cells arranged in rows and columns, and a plurality of word lines arranged corresponding to the plurality of rows of the memory cells; a test mode detecting circuit detecting in accordance with an external signal the fact that a test mode is set; and a refresh control circuit including a refresh timer determining a refresh period in a refresh operation of the memory cell array, and controlling the refresh operation, the refresh timer in the test mode issuing an oscillation signal having a shorter period than that in a normal operation.

Preferably, the refresh timer includes a first signal generator generating a first oscillation signal, a second signal generator generating a second oscillation signal having a shorter period than the first oscillation signal, and a selector selectively issuing the first and second oscillation signals in accordance with an output of the test mode detecting circuit, and issuing the second oscillation signal as the oscillation signal in the test mode.

According to the semiconductor memory device described above, the refresh period is changed in the test mode. In particular, the refresh period is reduced. Owing to this, when the refresh operation is executed for holding the state after the disturb test, the disturb state can be held more appropriately even if the device environment is strict.

Further, the invention provides a semiconductor memory device capable of fast operation.

According to a further aspect, a semiconductor memory device includes a memory cell array including a plurality of memory cells arranged in rows and columns, a plurality of word lines arranged corresponding to the plurality of rows, and a plurality of bit lines arranged corresponding to the plurality of columns; a control circuit controlling read/write operations of the memory cell array in synchronization with an internal clock; and an internal clock generator generating the internal clock having a higher frequency than a plurality of external signals having different phases, respectively, based on the plurality of external signals.

Preferably, the plurality of external signals have the substantially same frequency, the internal clock generator includes a plurality of logic circuits receiving different combinations each formed of two among the plurality of external signals, and a circuit performing logical OR among the outputs of the plurality of logic circuits to issue the internal clock, and each of the plurality of logic circuits issues a clock corresponding to the phase difference between the corresponding two external signals.

In particular, the semiconductor memory device further includes a clock buffer taking in an external clock, and a mode detecting circuit detecting an operation mode, and the control circuit controls read/write operations of the memory cell array in response to the output of the mode detecting circuit and in synchronization with the internal clock or the output of the clock buffer. The internal clock generated by the internal clock generator has a higher frequency than the external clock.

According to the semiconductor memory device described above, the internal clock corresponds to the phase differences between the plurality of external signals, and has the higher frequency than the external signal. Accordingly, the internal clock of the desired frequency can be produced in accordance with the externally supplied input, and the operation can be performed in synchronization with the internal clock.

Further, according to the semiconductor memory device, the internal clock of the higher frequency than the external clock can be produced, and the specific operation mode can be conducted in synchronization with the internal clock. For example, in the case where the disturb test is triggered by the internal clock of the higher frequency than the external clock, a short-cycle test can be conducted effectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in greater detail with reference to the drawings. The same components bear the same reference numbers or characters, and will not be described below.

[First Embodiment]

A semiconductor memory device according to a first embodiment of the invention will now be described. The semiconductor memory device according to the first embodiment of the invention performs a disturb test triggered by an external clock.

Figure 1:
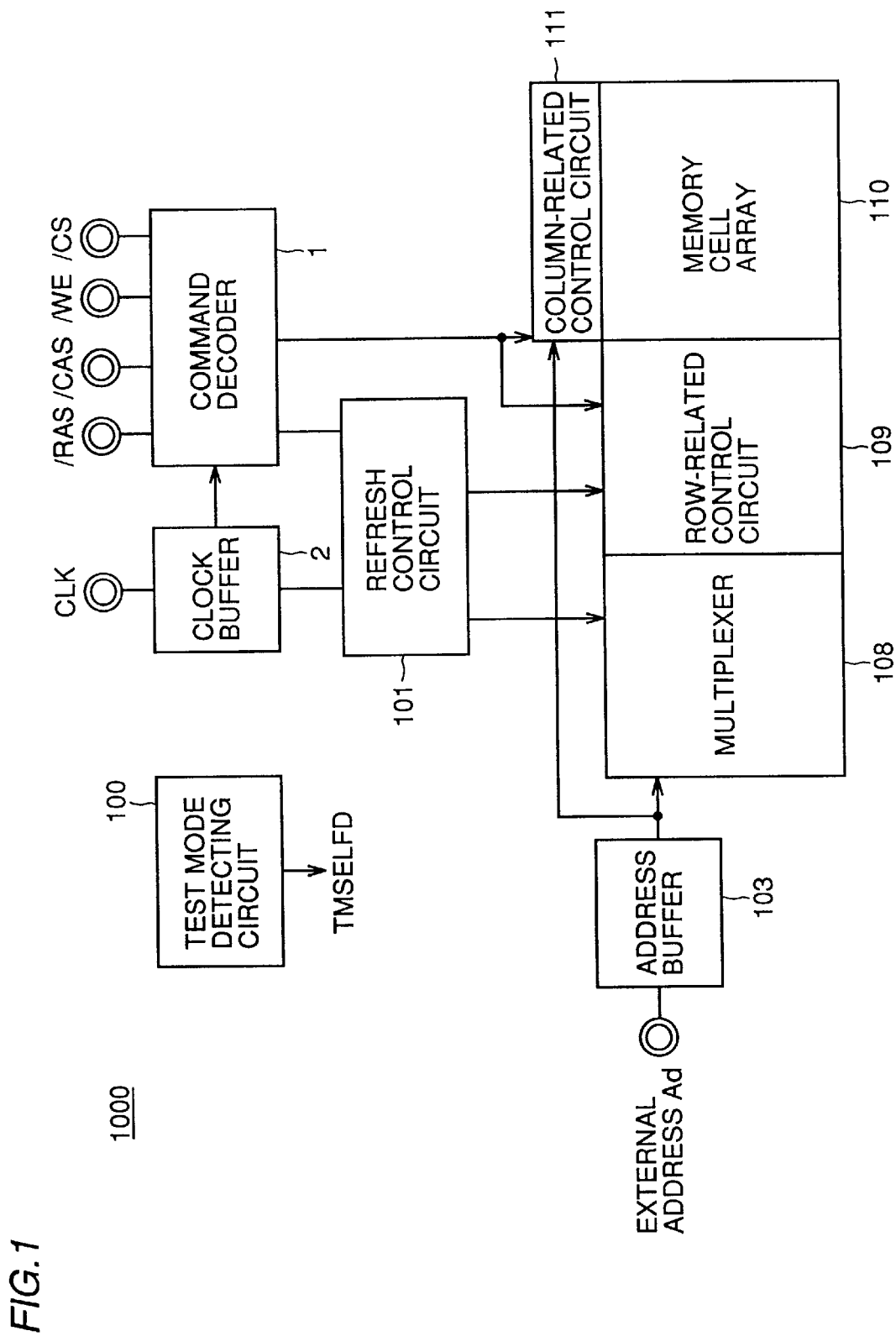
FIG. 1 shows by way of example a structure of a semiconductor memory device 1000 according to a first embodiment of the invention.

A structure of a semiconductor memory device 1000 according to a first embodiment of the invention will now be described with reference to FIG. 1. Semiconductor memory device 1000 shown in FIG. 1 performs rising and lowering of word lines by utilizing an auto-refresh function in a disturb test (which will be referred to as a "self-disturb test" hereinafter).

Semiconductor memory device 1000 includes a command decoder 1 which decodes external control signals (a row address strobe signal /RAS, a column address strobe signal /CAS, a write enable signal /WE and a chip select signal /CS) received via external command pins, and thereby issues a command for controlling the internal operation, a clock buffer 2 which receives external clocks CLK and others from an external clock pin CLK, a test mode detecting circuit 100 which detects a test mode in accordance with the external signals, a refresh control circuit 101 which controls a refresh operation, an address buffer 103 which receives an external address Ad, a multiplexer 108 which selectively outputs the outputs of address buffer 103 and refresh control circuit 101, a memory cell array 110 which includes a plurality of memory cells arranged in rows and columns, a plurality of word lines arranged corresponding to the rows, respectively, and a plurality of bit lines arranged corresponding to the columns, a row-related control circuit 109 controlling selection of the row in memory cell array 110, and a column-related control circuit 111 controlling selection of the column in memory cell array 110.

Figure 2:
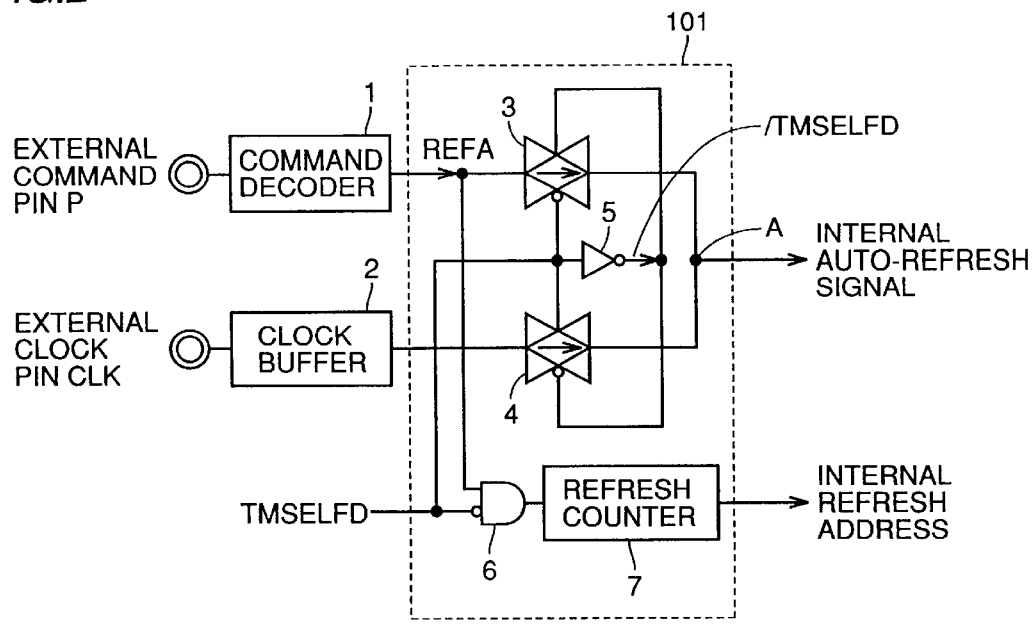
FIG. 2 shows a major portion of a refresh control circuit 101.

A major portion of refresh control circuit 101 will now be described with reference to FIG. 2. As shown in FIG. 2, refresh control circuit 101 includes transfer gates 3 and 4, an inverter 5, a logic circuit 6 and a refresh counter 7. Inverter 5 inverts a self-disturb test signal TMSELFD issued from test mode detecting circuit 100, and thereby issues self-disturb test signal /TMSELFD.

Transfer gate 3 responds to self-disturb test signals TMSELFD and /TMSELFD, and thereby issues onto a node A an auto-refresh command REFA issued from command decoder 1. Transfer gate 4 responds to self-disturb test signals TMSELFD and /TMSELFD, and thereby issues onto node A an internal clock issued from clock buffer 2.

The logic circuit 6 receives self-disturb test signal TMSELFD and auto-refresh command REFA. Refresh counter 7 operates the counter to increment its internal refresh address in response to auto-refresh command REFA sent from command decoder 1 when self-disturb test signal TMSELFD is at L-level.

From node A, the internal auto-refresh signal is issued. Row-related control circuit 109 performs the selection in the row direction based on the internal auto-refresh signal. The internal auto-refresh signal forms a trigger signal of the disturb operation.

Figure 3:
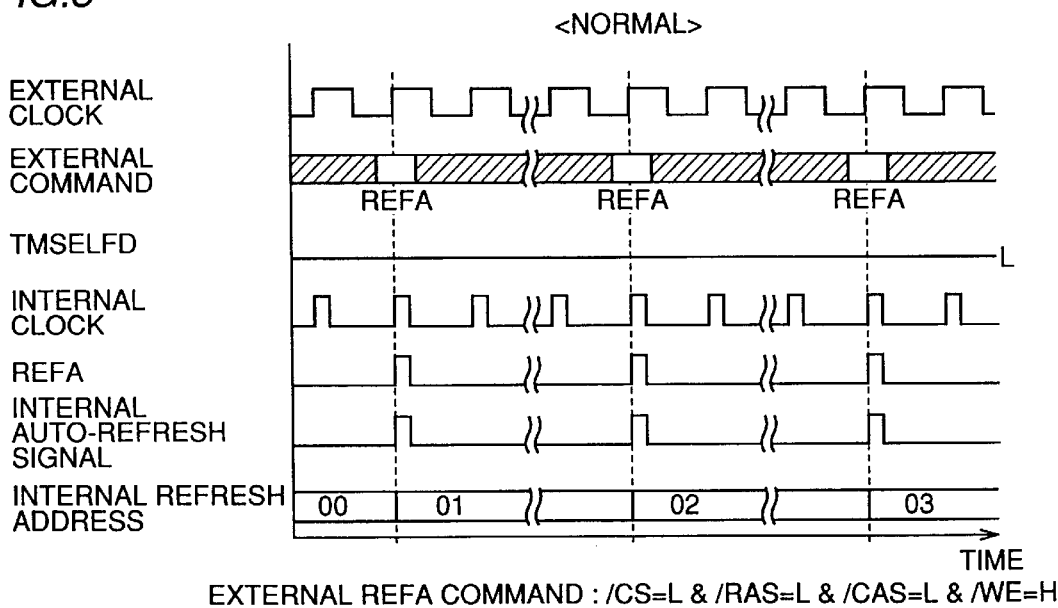
FIGS. 3 and 4 are timing charts showing an operation of the semiconductor memory device according to the first embodiment of the invention.

An operation of the semiconductor memory device according to the first embodiment of the invention will now be described with reference to FIGS. 3 and 4. FIG. 3 corresponds to the normal operation (normal mode), and FIG. 4 corresponds to the self-disturb test.

In the normal operation, as shown in FIG. 3, self-disturb test signal TMSELFD is at L-level. Accordingly, transfer gate 3 issues auto-refresh command REFA. During this, transfer gate 4 issues no output. Accordingly, the internal auto-refresh signal forms a pulse signal which is synchronized with auto-refresh command REFA issued from command decoder 1.

Logic circuit 6 issues a signal based on auto-refresh command REFA because self-disturb test signal TMSELFD is at L-level. Thereby, refresh counter 7 increments the internal refresh address in response to auto-refresh command REFA (from "00" through "01" and "02" to "03").

Figure 4:
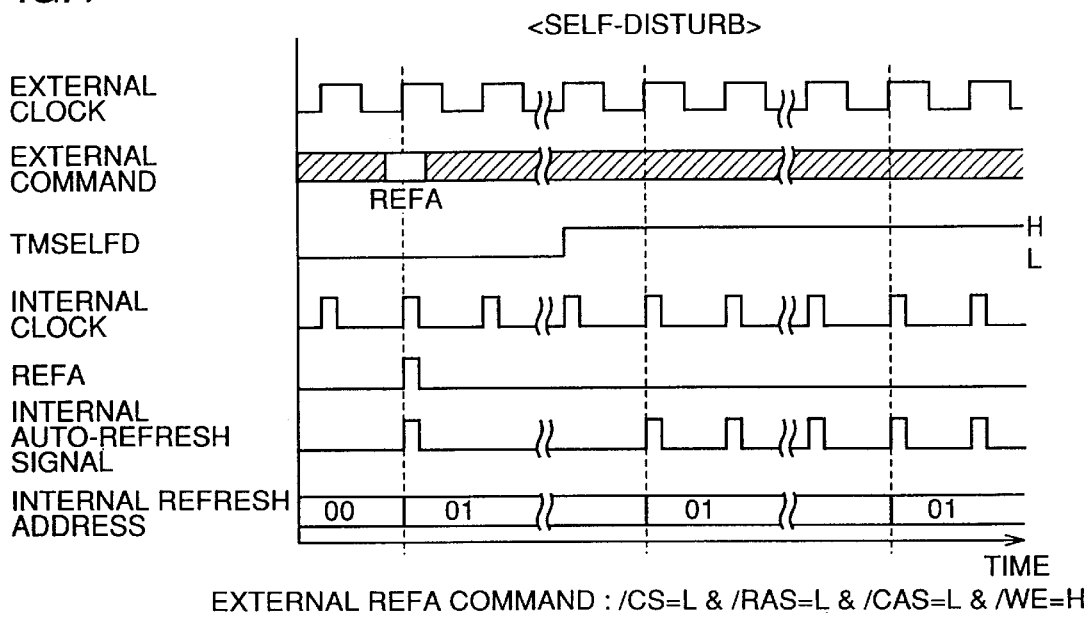

As shown in FIG. 4, when self-disturb test signal TMSELFD rises to H-level, the operation enters the self-disturb test mode. Thereby, transfer gate 4 issues the pulse signal. During this, transfer gate 3 issues no output. Accordingly, the internal auto-refresh signal forms a pulse signal synchronized with the internal clock issued from clock buffer 2. Thus, the refresh operation, which is triggered by external clock CLK instead of the external command, is performed when the test mode is detected.

The logic circuit 6 issues a signal at L-level when self-disturb test signal TMSELFD rises to H-level. Thereby, refresh counter 7 stops the counting. Thereby, the internal refresh address goes to a constant value of "01". Even if auto-refresh command REFA is externally and erroneously input, refresh counter 7 does not operate if self-disturb test signal TMSELFD is at H-level. As a result, the same word line is repetitively selected and deselected in the self-disturb test. The manner of selecting the word lines is not restricted to the above.

According to the semiconductor memory device of the first embodiment of the invention, the disturb test with a good timing accuracy and a short cycle can be executed using the external clock as a trigger even when a low-speed tester is used.

Figure 15:
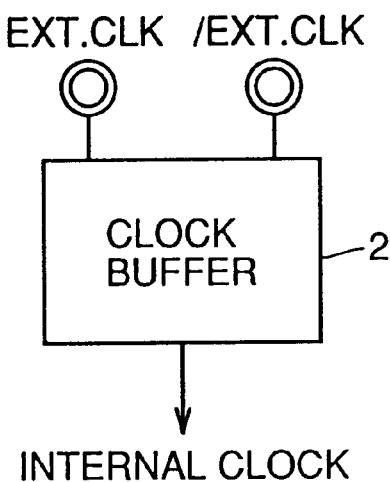
FIG. 15 shows inputs of a clock buffer 2 in an DDR-SDRAM.
Figure 16:
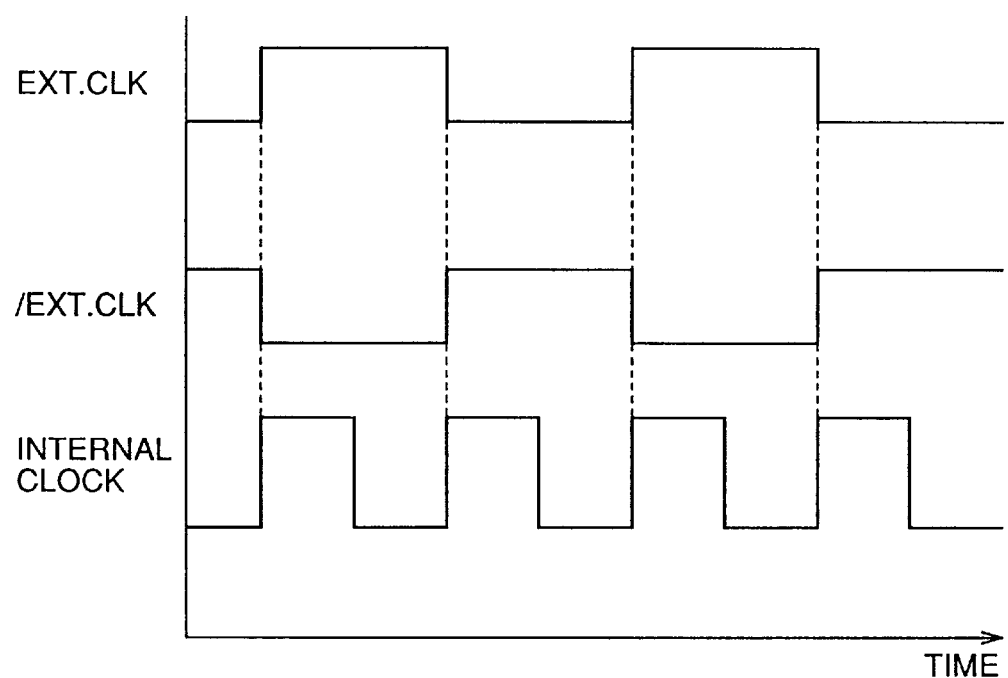
FIG. 16 is a timing chart showing an internal clock issued from clock buffer 2 in the DDR-SDRAM.

In the case of the DDR-SDRAM (Double-Data-Rate-SDRAM), clock buffer 2 receives an external clock EXT-.CLK and an external clock /EXT.CLK of the phase opposite to that of external clock EXT.CLK, as shown in FIG. 15. As shown in FIG. 16, clock buffer 2 issues the internal clock which has pulses corresponding to the rising and falling edges of external clock EXT.CLK, respectively. In the case of the DDR-SDRAM, therefore, the refresh operation can be triggered by the signal having double the frequency of the external clock.

[Second Embodiment]

Description will now be given on a semiconductor memory device of a second embodiment of the invention. When the self-disturb test is performed by a testing burn-in device which is a low-speed tester, all the devices are successively determined in a scanning manner after the disturb. Therefore, the determination of all the devices requires a long time. In order to prevent the refresh-over of the devices, therefore, all the devices are set in the self-refresh mode after the disturb test.

When a large number of devices are simultaneously tested in a burn-in apparatus, the devices may be subjected to an excessive thermal stress, and thereby may cause a refresh failure if the devices do not have sufficient refresh margins.

Figure 5:
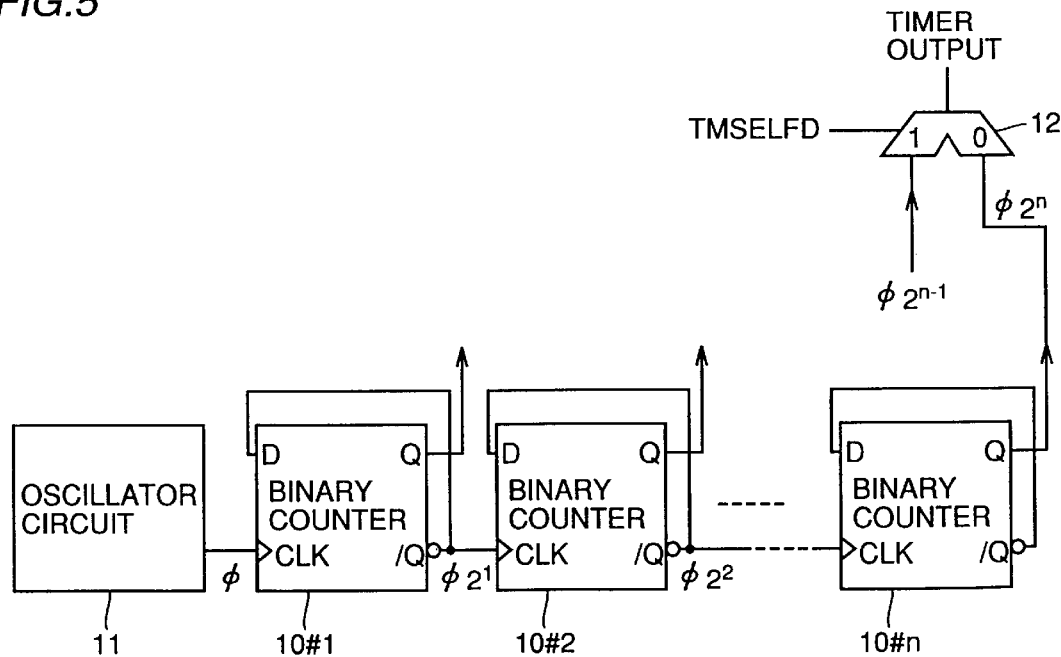
FIG. 5 shows a self-refresh timer according to a second embodiment of the invention.

For the above reason, a semiconductor memory device according to the second embodiment of the invention includes a self-refresh timer shown in FIG. 5 so that the refresh period in the self-disturb test is set to be shorter than that in the normal operation mode. The self-refresh timer shown in FIG. 5 is included in refresh timer 101 shown in FIG. 1.

As shown in FIG. 5, the self-refresh timer according to the second embodiment of the invention includes binary counters 10#1–10#n, an oscillator circuit 11 and a select circuit 12. Each of binary counters 10#1–10#n includes a CLK-pin, a /Q-pin, a D-pin and a Q-pin. The CLK-pin of binary counter 10#i (i=2–n) is connected to the /Q-pin of binary counter 10#i-1 in the preceding position, and the D-pin of binary counter 10#k (k=1–n) is connected to the /Q-pin. The CLK pin of binary counter 10#1 receives an oscillation signal φ which is an output of oscillator circuit 11. A signal $\phi 2^i$ which is prepared by dividing the frequency of oscillation signal φ by the ith power of 2 is sent from the Q-pin of binary counter 10#i (i=1–n).

Select circuit 12 selectively sends therefrom the outputs of binary counters 10#n−1 and 10#n in accordance with self-disturb test signal TMSELFD. The output thus sent forms the output of the self-refresh timer.

Figure 6:
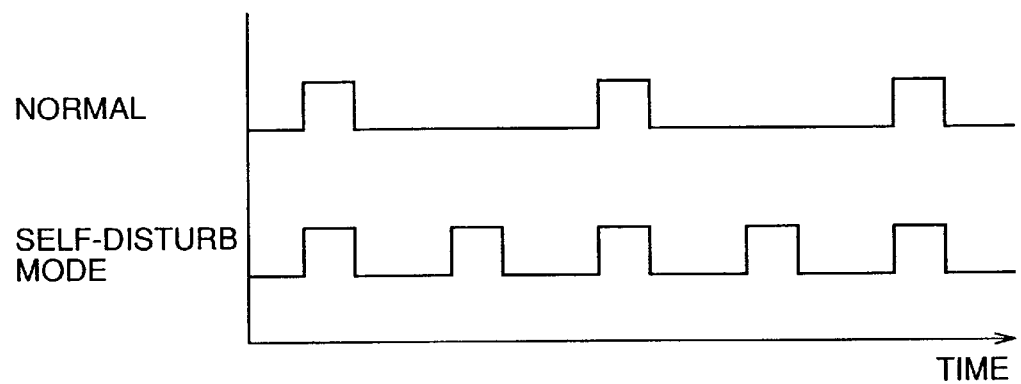
FIG. 6 is a timing chart showing an operation of the self-refresh timer according to the second embodiment of the invention.

Referring to FIG. 6, the operation of the self-refresh timer according to the second embodiment will now be described. Referring to FIGS. 5 and 6, self-disturb test signal TMSELFD is at L-level during the normal operation. Therefore, output $\phi 2^n$ of binary counter 10#n, which is prepared by dividing the frequency of oscillation signal φ by the nth power of 2, forms the output of the self-refresh timer. During the self-disturb test, self-disturb test signal TMSELFD is at H-level. Therefore, output $\phi 2^{n-1}$ of binary counter 10#n−1, which is prepared by dividing the frequency of oscillation signal φ by the (n−1)th power of 2, forms the output of the self-refresh timer.

According to the semiconductor memory device of the second embodiment of the invention, the refresh period during the self-disturb test is shorter than that during the normal operation. Owing to this, the state after the disturb test can be appropriately held.

[Third Embodiment]

Figure 14:
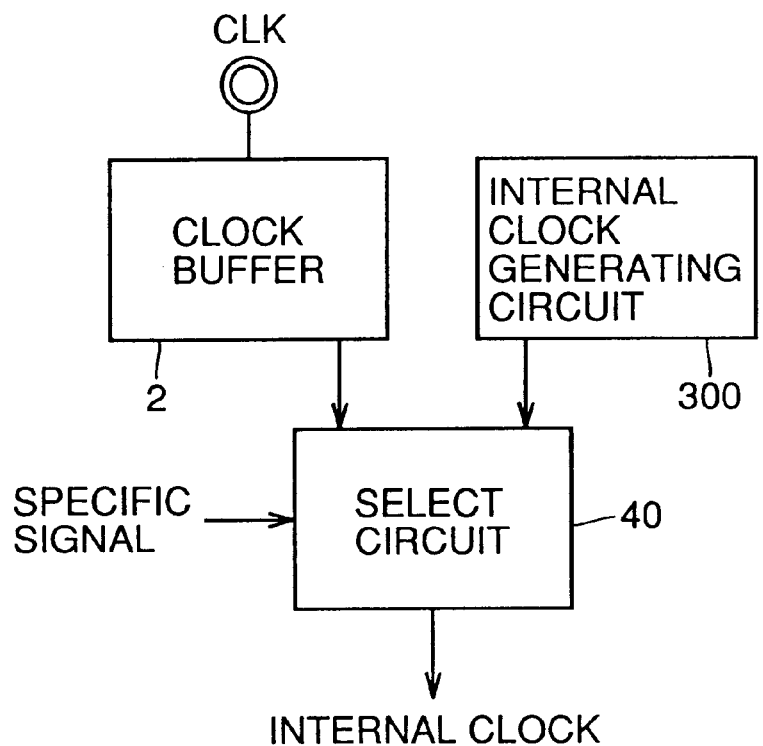
FIG. 14 shows a select circuit 40.

A semiconductor memory device according to a third embodiment of the invention will now be described. The semiconductor memory device according to the third embodiment of the invention includes an internal clock generating circuit 300 and a select circuit 40 in addition to the structures shown in FIG. 1. As shown in FIG. 14, select circuit 40 selectively issues either the output of clock buffer 2 or the output of internal clock generating circuit 300 as the internal clock in accordance with a specific signal.

In the case where self-disturb test signal TMSELFD is the specific signal, select circuit 40 issues, as the internal clock, the output of internal clock generating circuit 300 during the self-disturb test, and issues, as the internal clock, the output of clock buffer 2 during the operations other than the self-disturb test.

Figure 7:
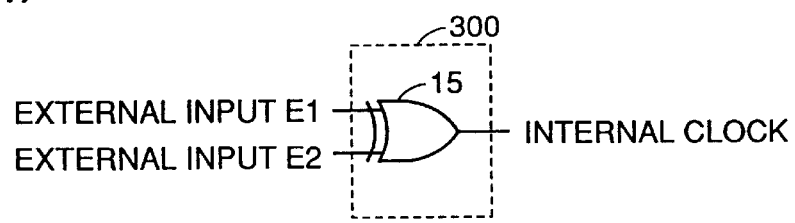
FIG. 7 is a view showing an internal clock generating circuit 300 according to a third embodiment of the invention.

The internal clock generating circuit shown in FIG. 7 includes an EXOR circuit 15. EXOR circuit 15 receives two external signals (external inputs E1 and E2), and issues the internal clock.

Figure 8:
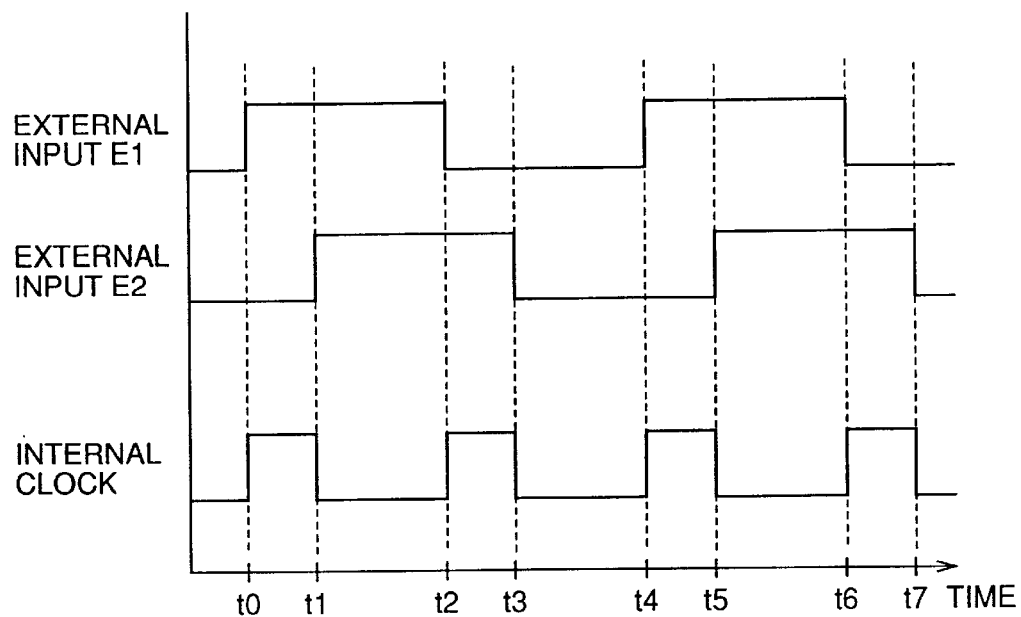
FIG. 8 is a timing chart showing an operation of the semiconductor memory device according to the third embodiment of the invention.

An operation of the semiconductor memory device according to a third embodiment of the invention will now be described with reference to FIG. 8. For example, as shown in FIG. 8, external input E1 is set to H-level at times t0 and t4, and is set to L-level at times t2 and t6. In contrast to this, external input 2 is set to H-level at times t1 and t5, and is set to L-level at times t3 and t7. Thereby, the internal clock issued from EXOR circuit 15 attains H-level during periods of t0–t1, t2–t3, t4–t5 and t6–t7.

Accordingly, external inputs E1 and E2 may have the substantially same periods and the phases which are shifted from each other, respectively. Thereby, the internal clock having the doubled frequency can be obtained. By performing the self-disturb test with the above internal clock, the short-cycle test can be performed more effectively than the self-disturb test of the short cycle according to the first embodiment. Accordingly, the speed of test can be increased even if the low-speed tester is used.

[Fourth Embodiment]

A semiconductor memory device according to a fourth embodiment of the invention will now be described. The semiconductor memory device according to the fourth embodiment of the invention includes an internal clock generating circuit 400 instead of internal clock generating circuit 300 described in the third embodiment. Select circuit 40 issues either the output of clock buffer 2 or the output of internal clock generating circuit 400 as the internal clock in accordance with a specific signal.

Figure 9:
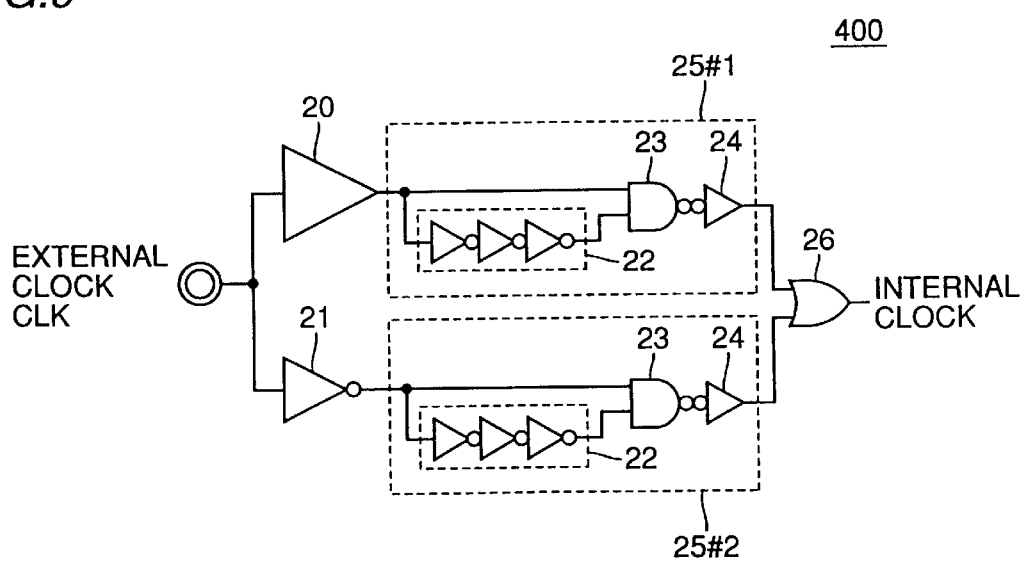
FIG. 9 shows an internal clock generating circuit 400 according to a fourth embodiment of the invention.

The internal clock generating circuit 400 shown in FIG. 9 includes buffers 20 and 21, one-shot pulse generating circuits 25#1 and 25#2, and an OR gate 26. Buffers 20 and 21 issue outputs of different logics, respectively. Buffer 20 issues the signal of the same logic as external clock CLK. Buffer 21 issues an inverted signal of external clock CLK.

One-shot pulse generating circuits 25#1 and 25#2 are provided corresponding to buffers 20 and 21, respectively. Each of one-shot pulse generating circuits 25#1 and 25#2 includes a delay circuit 22 having a plurality of inverters, an NAND circuit 23 and an inverter 24.

The delay circuit 22 delays the output of the corresponding buffer. NAND circuit 23 receives the output of the corresponding buffer and the output of the delay circuit. Inverter 24 inverts and issues the output of NAND circuit 23.

Delay circuit 22 delays the output of the corresponding buffer. NAND circuit 23 receives the output of the corresponding buffer and the output of the delay circuit. Inverter 24 inverts and issues the output of NAND circuit 23.

The OR gate receives the outputs of one-shot pulse generating circuits 25#1 and 24#2, and issues the internal clock.

Figure 10:
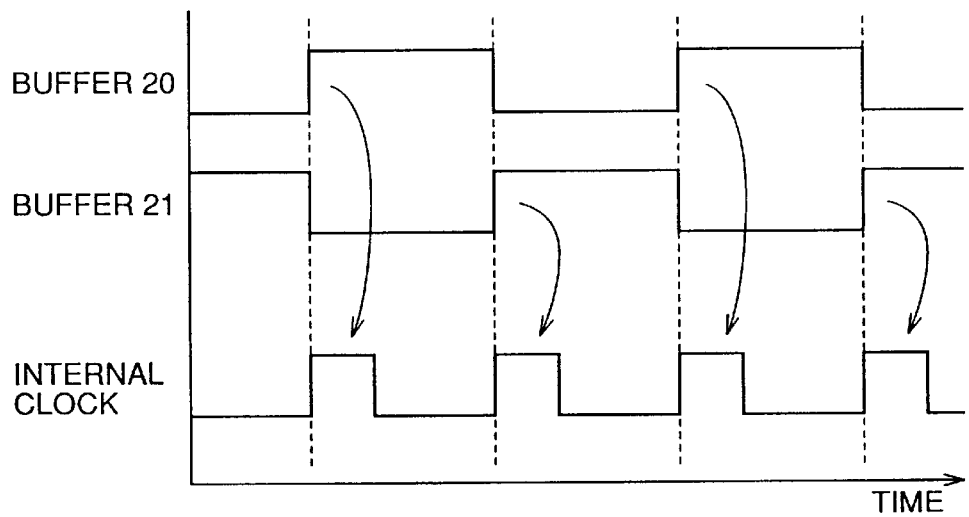
FIG. 10 is a timing chart showing an operation of a semiconductor memory device according to the fourth embodiment of the invention.

Referring to FIG. 10, description will now be given on an operation of the semiconductor memory device according to the fourth embodiment of the invention. As shown in FIG. 10, the outputs of buffers 20 and 21 have opposite phases, respectively. When the output of buffer 20 rises, the internal clock attains and stays at H-level for a constant period. Likewise, the internal clock attains and stays at H-level for the constant period when the output of buffer 21 rises.

According to the fourth embodiment, as described above, the device is provided with one-shot pulse generating circuits 25#1 and 25#2, which produce the one-shot pulse signals at the rising edges of the outputs of the two buffers, and the OR gate receives the outputs of the one-shot pulse generating circuits 25#1 and 25#2 for generating the internal clock. In this operation, each of the two signals (outputs of buffers 20 and 21) having different logics provides one rising edge (i.e., two rising edges in total) in one period of external clock CLK. Therefore, the internal clock has double the frequency of the external clock.

By performing the self-disturb test with the foregoing internal clock, the short-cycle test can be performed more effectively than the self-disturb test of the short cycle already described with reference to the first embodiment.

[Fifth Embodiment]

Description will now be given on a semiconductor memory device according to a fifth embodiment of the invention. The foregoing fourth embodiment of the invention employs internal clock generating circuit 400, which includes buffers 20 and 21, and generates the internal clock having double the frequency of the external clock. However, if buffers 20 and 21 have different characteristics, this results in change in duty ratio between the two internal clocks generated within one period. In view of this, the semiconductor memory device of the fifth embodiment of the invention uses, as the internal clock, an output of an internal clock generating circuit 500 shown in FIG. 11.

Figure 11:
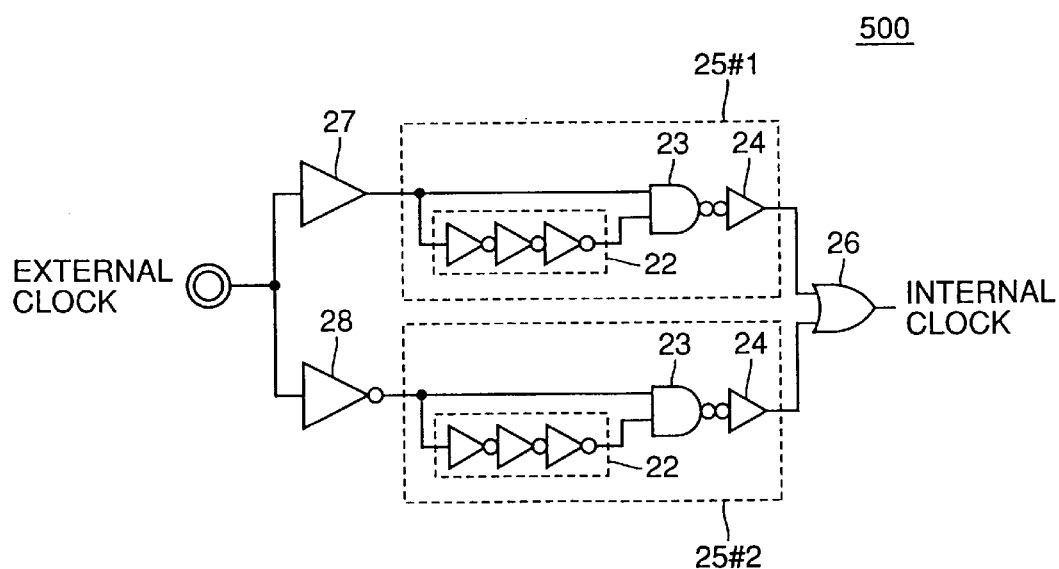
FIG. 11 shows an internal clock generating circuit 500 according to a fifth embodiment of the invention.

The internal clock generating circuit 500 shown in FIG. 11 includes buffers 27 and 28, one-shot pulse generating circuits 25#1 and 25#2, and an OR gate 26. Buffers 27 and 28 have equivalent circuit characteristics. Buffer 27 issues a signal of the same logic as external clock CLK. Buffer 28 issues a signal prepared by inverting external clock CLK.

One-shot pulse generating circuits 25#1 and 25#2 are provided corresponding to buffers 27 and 28, respectively. OR gate 26 receives the outputs of one-shot pulse generating circuits 25#1 and 25#2, and issues the internal clock.

Owing to the above structure, it is possible to generate the uniform internal clock having double the frequency of the external clock. By performing the self-disturb test with the above internal clock, the test can be performed with good timing accuracy. Compared with the self-disturb test of the short cycle already described with reference to the first embodiment, the short-cycle test can be performed more effectively.

[Sixth Embodiment]

Figure 12:
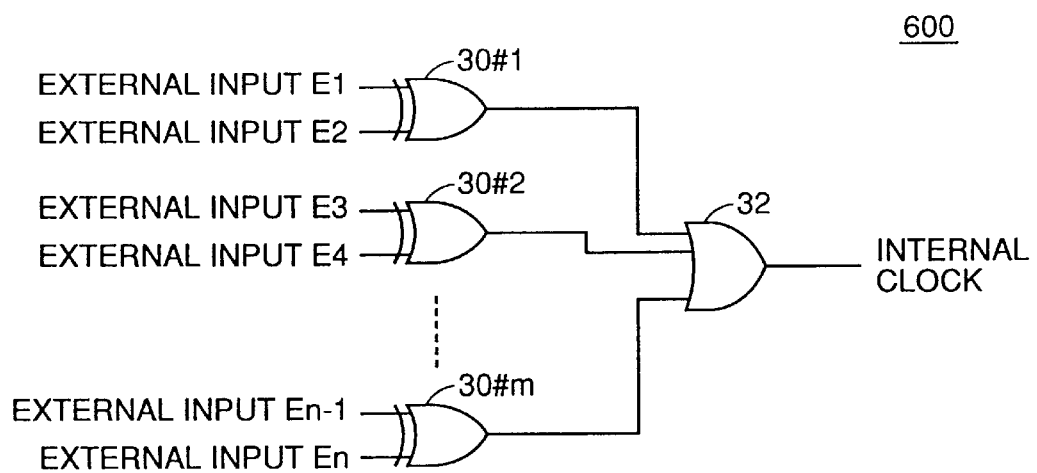
FIG. 12 shows an internal clock generating circuit 600 of a sixth embodiment of the invention.

A semiconductor memory device according to a sixth embodiment of the invention will now be described. The sixth embodiment of the invention provides a structure for utilizing a further faster internal clock. A semiconductor memory device according to the sixth embodiment of the invention includes an internal clock generating circuit 600 shown in FIG. 12.

Internal clock generating circuit 600 includes EXOR circuits 30#1–30#m and an OR gate 32. Each of EXOR circuits 30#1–30#m receives two external inputs. For example, EXOR circuit 30#1 receives external inputs E1 and E2, EXOR circuit 30#2 receives external inputs E3 and E4, and EXOR circuit 30#m receives external inputs En−1 and En. OR gate 32 receives the outputs of EXOR circuits 30#1–30#m, issues the logical sum of them as an internal clock.

Figure 13:
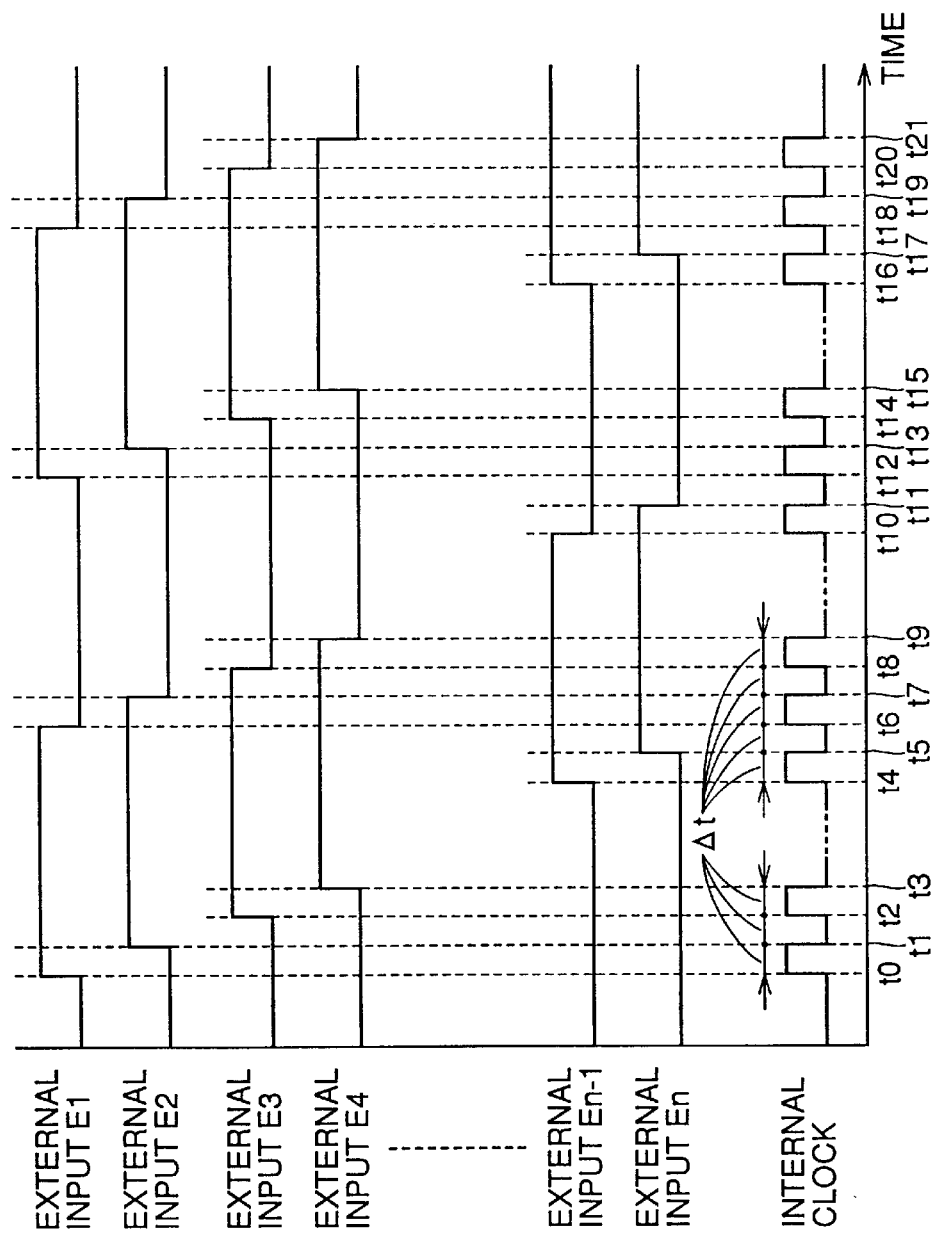
FIG. 13 is a timing chart showing an operation of the semiconductor memory device of the sixth embodiment of the invention.

FIG. 13 is a timing chart showing an operation of the semiconductor memory device according to the sixth embodiment of the invention. The respective external inputs E1, E2, . . . are formed of signals having the substantially same period, and are supplied with phases shifted by a predetermined interval from each other. A difference in rising timing (or falling timing) between external inputs Ei and Ei+1 is equal to Δt (constant).

In the figure, external input E1 is at H-level during periods between times t0 and t6 and between times t12 and t18. External input E2 is at H-level during periods between times t1 and t7 and between times t13 and t19. External input E3 is at H-level during periods between times t2 and t8 and between times t14 and t20. External input E4 is at H-level during periods between times t3 and t9 and between times t15 and t21. External input En−1 is at H-level during periods between times t4 and t10 and from time t16. External input En is at H-level during periods between times t5 and t11 and from time t17. There is a relationship of ti<ti+1. There is also a relationship of Δt=t1−t0=t2−t1=t3−t2=t5−t4=t6−t5=t7−t6=t8−t7=t9−t8, . . . .

EXOR circuit 30#1 issues the clock corresponding to the phase difference between external inputs E1 and E2. EXOR circuit 30#2 issues the clock corresponding to the phase difference between external inputs E3 and E4. EXOR circuit 30#m issues the clock corresponding to the phase difference between external inputs En−1 and En. Likewise, each of the EXOR circuits which are not shown issues the clock corresponding to the phase difference between the two external inputs. OR gate 32 receiving these clocks issues the internal clock of the uniform period.

According to the structure of the sixth embodiment of the invention, the pulse interval and the pulse width of the internal clock can be controlled based on the plurality of external inputs. By inputting the external clock of the predetermined frequency F as the external input, it is possible to produce the internal clock of the higher frequency than the above frequency F.

By selectively issuing either the output of clock buffer 2 or the output of internal clock generating circuit 600 from select circuit 40, the semiconductor memory device can operate in synchronization with the internal clock, which has the higher frequency than the external clock, and is generated from internal clock generating circuit 600 in accordance with the specific signal.

If the self-disturb test signal TMSELFD is used as the specific signal, the self-disturb test can be performed using the internal clock of the higher frequency than the external dock. Therefore, the short-cycle test can be performed more effectively. Accordingly, the test speed can be increased even when a slow tester is used.

The specific signal is not restricted to the self-disturb test signal TMSELFD issued from test mode detecting circuit 100.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory cell array including a plurality of memory cells arranged in rows and columns, and a plurality of word lines arranged corresponding to the plurality of rows of said memory cells;
    a test mode detecting circuit detecting in accordance with an external signal the fact that a test mode is set; and
    a control circuit being responsive to the output of said test mode detecting circuit and triggered by an external clock to perform control for conducting a disturb test on said memory cell array, said external clock including a first external signal and a second external signal having the substantially same period as the first external signal.

2. The semiconductor memory device according to claim 1, wherein
    said semiconductor memory device further comprises an internal clock generator generating an internal clock based on a phase difference between said first and second external signals; and
    said control circuit performs the control for conducting said disturb test triggered by the internal clock.

3. The semiconductor memory device according to claim 1, wherein
    said second external signal has the different phase from the first external signal;
    said semiconductor memory device further comprises an internal clock generator generating an internal clock in accordance with said first and second external signals; and
    said control circuit performs the control for conducting said disturb test triggered by the internal clock.

4. The semiconductor memory device according to claim 3, wherein
    said internal clock has pulses corresponding to rising and falling edges of said first external signal.

5. A semiconductor memory device comprising:
- a memory cell array including a plurality of memory cells arranged in rows and columns, and a plurality of word lines arranged corresponding to the plurality of rows of said memory cells;
- a test mode detecting circuit detecting in accordance with an external signal the fact that a test mode is set;
- a control circuit being responsive to the output of said test mode detecting circuit and triggered by an external clock to perform control for conducting a disturb test on said memory cell array;
- a clock buffer for receiving said external clock; and
- a row select control circuit for controlling selection of the row in said memory cell array, wherein
- said control circuit is responsive to the output of said test mode detecting circuit to issue a signal determining operation timing of said row select control circuit based on the output of said clock buffer.

6. The semiconductor memory device according to claim 5, wherein
- said control circuit includes a refresh circuit issuing an automatic refresh signal for executing a refreshing operation of said memory cell array, and
- said refresh circuit operates in a normal operation to issue said automatic refresh signal in response to an external command, and operates in said test mode to issue said automatic refresh signal in synchronization with the output of said clock buffer.

7. A semiconductor memory device comprising:
- a memory cell array including a plurality of memory cells arranged in rows and columns, and a plurality of word lines arranged corresponding to the plurality of rows of said memory cells;
- a test mode detecting circuit detecting in accordance with an external signal the fact that a test mode is set;
- a control circuit being responsive to the output of said test mode detecting circuit and triggered by an external clock to perform control for conducting a disturb test on said memory cell array;
- a first buffer taking in said external clock, a second buffer taking in said external clock, and an internal clock generator generating an internal clock having double the frequency of said external clock in accordance with the outputs of said first and second buffers, wherein
- said control circuit performs the control for conducting said disturb test triggered by the internal clock.

8. The semiconductor memory device according to claim 7, wherein
- said first and second buffers have the substantially same characteristics, and
- said internal clock generator generates said internal clock having the substantially constant pulse width based on the outputs of said first and second buffers.

* * * * *